(12) United States Patent
Ishikawa

(10) Patent No.: US 7,613,968 B2
(45) Date of Patent: Nov. 3, 2009

(54) DEVICE AND METHOD FOR JTAG TEST

(75) Inventor: Katsuya Ishikawa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 74 days.

(21) Appl. No.: 11/174,727

(22) Filed: Jul. 6, 2005

(65) Prior Publication Data

US 2006/0179373 A1 Aug. 10, 2006

(30) Foreign Application Priority Data

Feb. 9, 2005 (JP) .............................. 2005-033690

(51) Int. Cl.
G01R 31/28 (2006.01)
G01R 27/28 (2006.01)
G01R 31/00 (2006.01)
G01R 31/14 (2006.01)
G11C 29/00 (2006.01)
G06F 17/50 (2006.01)

(52) U.S. Cl. ........................ 714/727; 365/201; 714/724; 716/4; 702/117

(58) Field of Classification Search .................. None
See application file for complete search history.

(56) References Cited

U.S. PATENT DOCUMENTS

| 5,764,076 | A | * | 6/1998 | Lee et al. ...................... 326/38 |
| 5,898,776 | A | * | 4/1999 | Apland et al. .................. 326/8 |
| 5,926,201 | A | * | 7/1999 | Fleming et al. ............. 347/237 |
| 6,122,762 | A | * | 9/2000 | Kim ............................. 714/726 |
| 6,145,100 | A | * | 11/2000 | Madduri ........................ 714/45 |
| 6,212,628 | B1 | * | 4/2001 | Abercrombie et al. ....... 712/226 |
| 6,246,614 | B1 | * | 6/2001 | Ooishi ......................... 365/191 |
| 6,266,793 | B1 | * | 7/2001 | Mozdzen et al. ............ 714/727 |
| 6,499,125 | B1 | * | 12/2002 | Ohta et al. ................... 714/734 |
| 6,539,511 | B1 | * | 3/2003 | Hashizume ................... 714/727 |
| 6,653,957 | B1 | | 11/2003 | Patterson et al. |
| 6,658,632 | B1 | * | 12/2003 | Parulkar et al. ................ 716/4 |
| 6,862,705 | B1 | * | 3/2005 | Nesbitt et al. ................ 714/729 |
| 6,937,493 | B2 | * | 8/2005 | Krause et al. .................. 365/63 |
| 6,983,441 | B2 | * | 1/2006 | Wescott ......................... 716/17 |
| 6,988,230 | B2 | | 1/2006 | Vermeulen et al. |

(Continued)

FOREIGN PATENT DOCUMENTS

JP 11-218560 A 8/1999

(Continued)

OTHER PUBLICATIONS

Kazumi Sakamaki, "JTAG test-Basics and Applications", Mar. 15, 2003, pp. 53-54, CQ Publishing Company.

Primary Examiner—Cynthia Britt
Assistant Examiner—Guerrier Merant
(74) Attorney, Agent, or Firm—Arent Fox LLP

(57) ABSTRACT

In order to realize a JTAG test of a printed board including a semiconductor device having JTAG test unsupported input/output terminals inside thereof, one device is logically divided into two devices such as a JTAG test supported device and a JTAG test unsupported device, boundary scan FFs are inserted between the two devices to be combined with another device configured in the same way and the JTAG test unsupported parts of both devices are equivalently combined to be regarded as one JTAG test unsupported device. Then, this device is sandwiched by the JTAG test supported devices and a JTAG test is conducted.

12 Claims, 12 Drawing Sheets

U.S. PATENT DOCUMENTS

| | | |
|---|---|---|
| 6,990,618 B1 * | 1/2006 | Lulla et al. .................... 714/727 |
| 7,088,091 B2 * | 8/2006 | Abdennadher ........... 324/158.1 |
| 2003/0046015 A1 | 3/2003 | Gotoh et al. |
| 2003/0093730 A1 * | 5/2003 | Halder et al. ................ 714/724 |
| 2003/0163773 A1 * | 8/2003 | O'Brien et al. ............. 714/726 |
| 2003/0188243 A1 * | 10/2003 | Rajan ......................... 714/731 |
| 2003/0229835 A1 | 12/2003 | Whetsel |
| 2004/0001432 A1 * | 1/2004 | Wescott ....................... 370/217 |
| 2005/0138503 A1 * | 6/2005 | Whetsel ....................... 714/724 |

FOREIGN PATENT DOCUMENTS

| | | |
|---|---|---|
| JP | 11-271400 A | 10/1999 |
| JP | 2000-0045795 A | 7/2000 |
| JP | 2002-373086 A | 12/2002 |
| JP | 2003-78020 A | 3/2003 |
| JP | 2003-344508 | 12/2003 |
| JP | 2004-069650 A | 3/2004 |
| JP | 2004-135337 A | 4/2004 |
| JP | 2005-503563 A | 2/2005 |
| KR | 20010048756 | 6/2001 |
| KR | 20040057495 | 7/2004 |
| TW | 311176 | 7/1997 |
| TW | 484016 B | 4/2002 |
| TW | 229741 B | 3/2005 |
| WO | WO 02/057921 A1 | 7/2002 |

\* cited by examiner

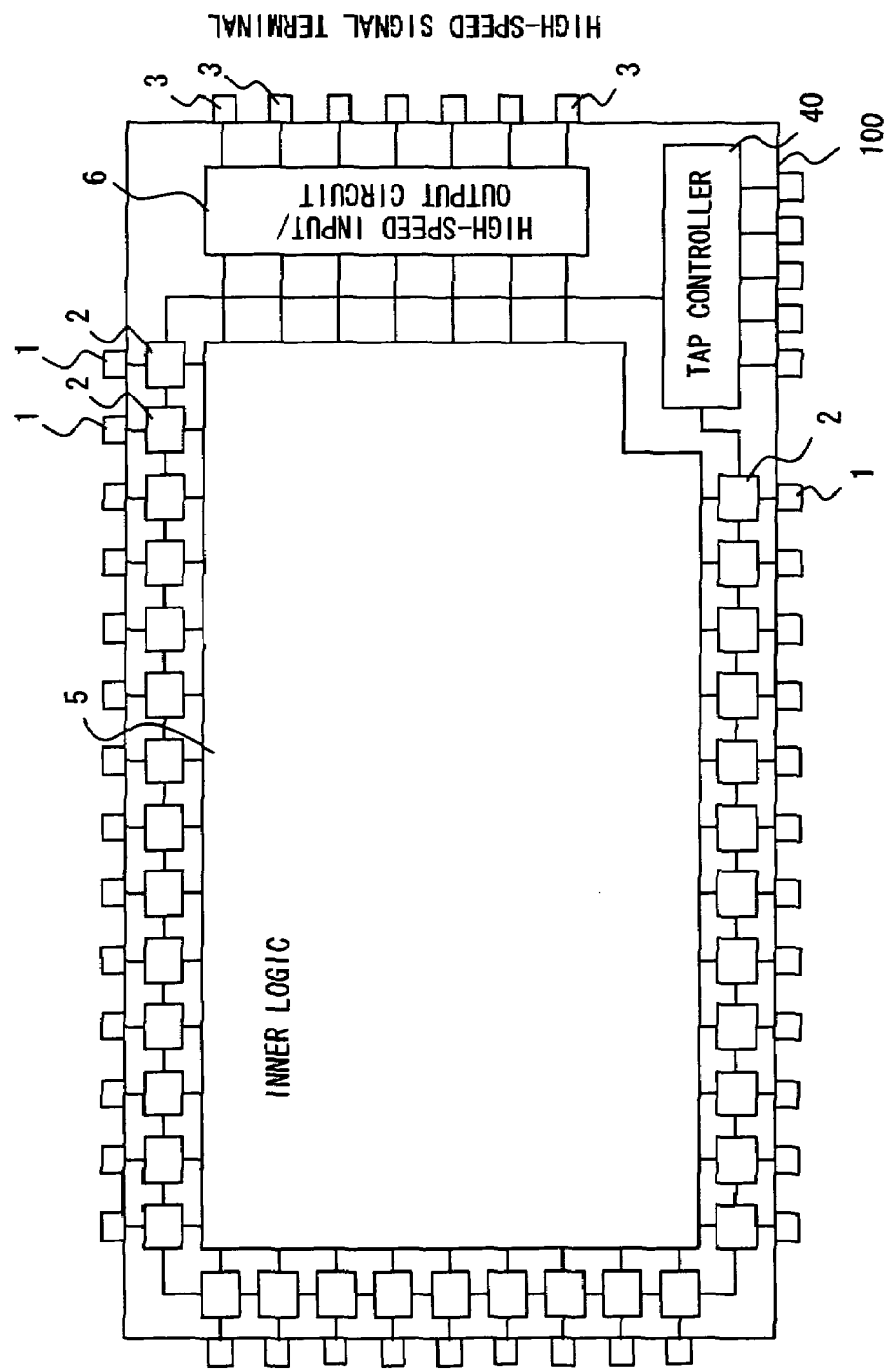
F I G. 1 A

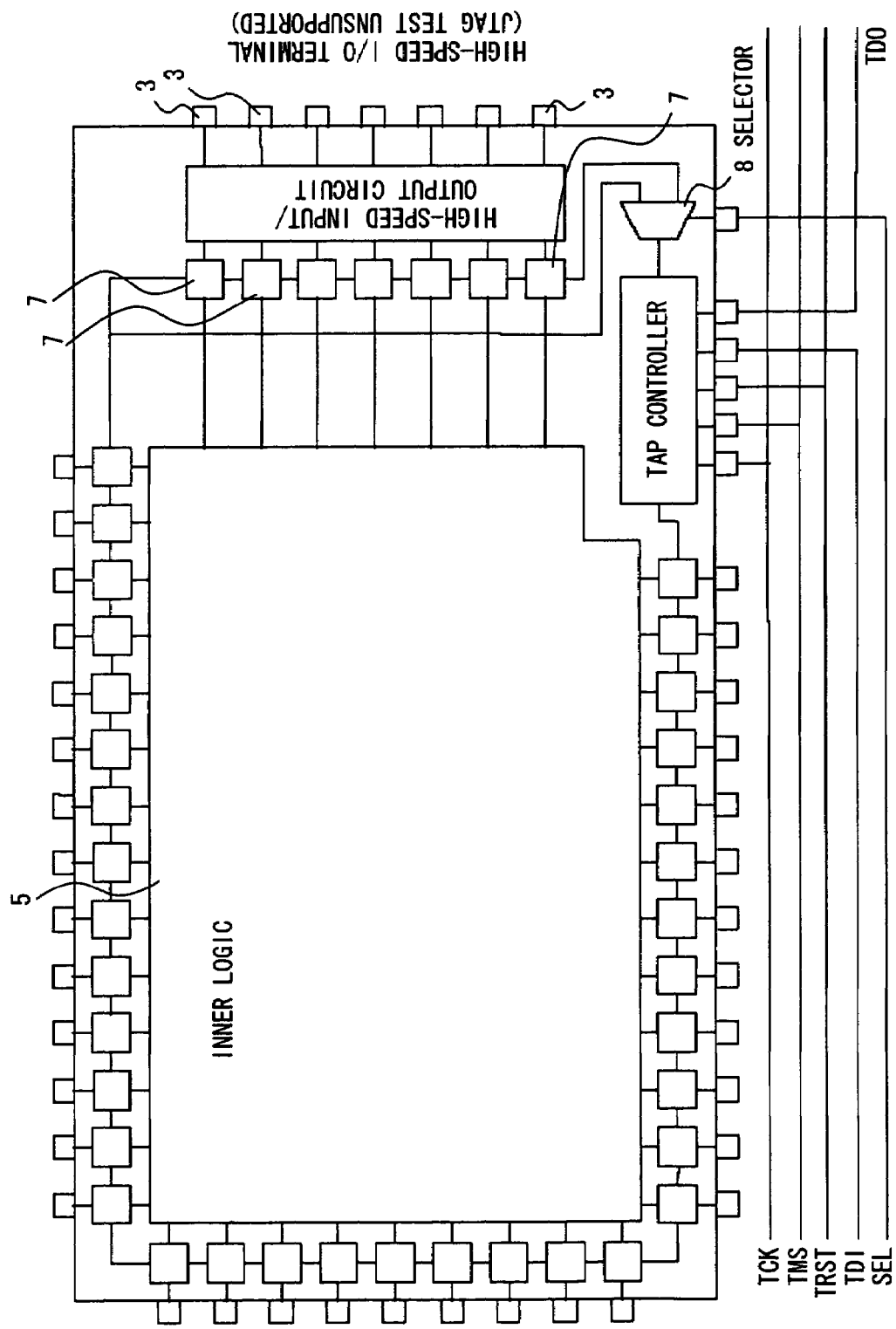
F I G. 6

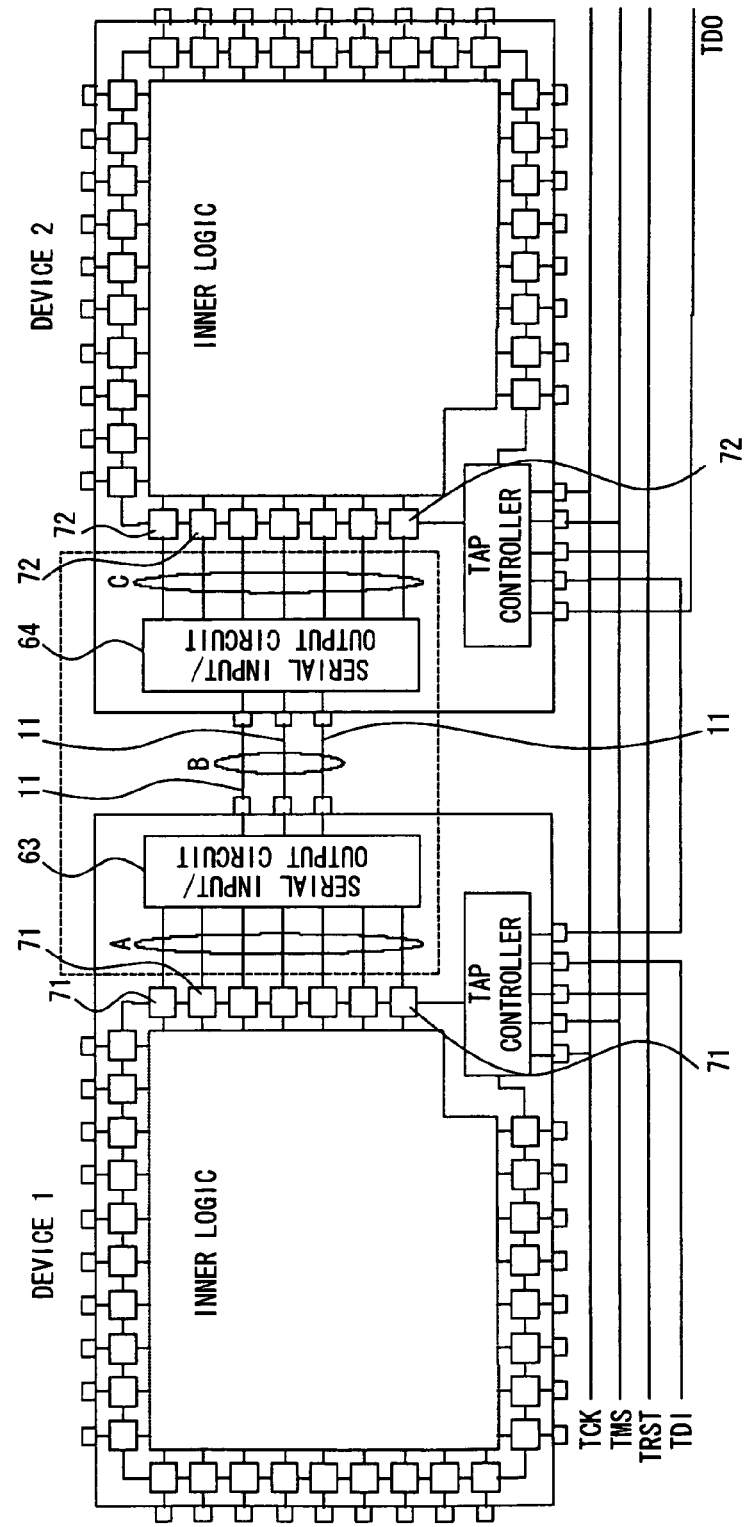
F I G. 8

DEVICE AND METHOD FOR JTAG TEST

CROSS-REFERENCE TO RELATED APPLICATION

This application is based upon and claiming the benefit of priority from the prior Japanese Patent Application No. 2005-033690, filed on Feb. 9, 2005, the entire contents of which are incorporated herein by reference.

BACKGROUND OF THE INVENTION

1. Field of the Invention

The present invention relates to device and method for JTAG test and especially relates to device and method for JTAG test of a semiconductor device having a JTAG test unsupported terminal at one part thereof.

2. Description of the Related Art

A JTAG (Joint Test Action Group) test is a method of sequentially scanning all external input/output pins of a semiconductor device (integrated circuit), inputting/outputting test data and conducting a test of both an internal function of the semiconductor device and an implemented printed circuit board. Therefore, this test has become a standard specification. The detailed explanation of the JTAG test is described in "Fundamentals and Applications of JTAG Test" (Kazumi Sakamaki, CQ Publication Co.)

Recently, the number of semiconductor devices that support a JTAG test has increased in order to execute a connection test, the debug of a printed circuit board, programs of a writable ROM, etc. when a semiconductor device is mounted on a printed circuit board. However, there are some semiconductor devices in which terminals for inputting/outputting high-speed signals do not support a JTAG test.

FIG. 1A shows such a conventional example. In FIG. 1A, a power source and a GND terminal are abbreviated and boundary scan flip-flops (FF) 2 are inserted into all signal terminals 1 except for a high-speed signal terminal 3. A test access port (TAP) controller 40 for controlling a JTAG test is mounted on a device 100.

FIG. 1B shows a test access port (TAP) that is mounted on a JTAG supported semiconductor device and carries out a JTAG test by externally accessing a circuit block in the semiconductor device. A data register 42 corresponds to a boundary scan FF described in FIG. 1A. The TAP controller 40 described in FIG. 1A includes a TAP control unit 41, a bypass register 43, a command register 44, multiplexers 45 and 46 except for the data register 42 that are all described in FIG. 1B. Terminals include a test data input TDI, a test data output TDO, and a test reset TRST, a test mode selection TMS and a test clock TCK that are control terminals.

The AC characteristic of a terminal of the device 100 is a standard related to data transmission between devices that are not correlated with each other in respect of the production. Since the setup, etc. become further difficult than that in a device if the clock cycles are the same, there is a problem such that the high-speed signal terminal 3 cannot satisfy the AC timing of the terminal 3 if a boundary scan FF is inserted into the terminal 3.

Therefore, the boundary scan FF is inserted into terminals except for a terminal for inputting/outputting a high-speed signal to configure a chain. For example, a terminal for inputting/outputting a high-speed signal includes a memory terminal using an SSTL 2 that is high-speed I/O terminal, etc., a terminal for serially inputting/outputting data, etc. In the case where data are serially input/output, data should be input/output at a rate faster than that of an inner logic.

In the "Fundamentals and Applications of JTAG Test", a JTAG test method in the case of including a JTAG test unsupported device on a printed circuit board is described. This method is explained in FIG. 2.

If the inner logic of this device is specified although a JTAG test unsupported device 300 is present on a printed circuit board, a JTAG test can be conducted by sandwiching the JTAG test unsupported device 300 with JTAG test supported devices 210 and 220.

SUMMARY OF THE INVENTION

The present invention is made in consideration of the above-mentioned problem. A problem to be solved is to enable a JTAG test of a printed circuit board that includes a semiconductor device having a JTAG test unsupported input/output terminal at one part thereof. In order to achieve the above-mentioned object, in a semiconductor device related to the present invention comprising: a JTAG test unsupported external terminal for a high-speed interface; a JTAG test supported external terminal; and a high-speed input/output circuit for inputting/outputting signals between the external terminal for a high-speed interface and an inner circuit, a boundary scan flip-flop is provided between the inner circuit and the high-speed input/output circuit.

In order to achieve the above-mentioned object, in the semiconductor device related to the present invention comprising: a JTAG test unsupported external terminal for a high-speed interface; a JTAG test supported external terminal; and a high-speed input/output circuit for inputting/outputting signals between the external terminal for a high-speed interface and an inner circuit, a boundary scan flip-flop that is inserted between the inner circuit and the high-speed input/output circuit is provided. Furthermore, it is appropriate that a chain for boundary scan can be prepared by a boundary scan flip-flop of the JTAG test supported external terminal and the inserted boundary scan flip-flop.

In order to achieve the above-mentioned object, in the semiconductor device related to the present invention comprising: a JTAG test unsupported external terminal for a high-speed interface; a JTAG test supported external terminal; and a high-speed input/output circuit for inputting/outputting signals between the external terminal for a high-speed interface and an inner circuit, a first controller including: a boundary scan flip-flop that is inserted between the inner circuit and the high-speed input/output circuit; a data input terminal used for a boundary scan flip-flop of the JTAG test supported external terminal and for externally inputting data, and a second controller including: a data input terminal used for the inserted boundary scan flip-flop and for externally inputting data; and a data output terminal for outputting data to an external entity, are provided. Furthermore, it is appropriate that the data output terminal of the first controller and the data input terminal of the second controller are connected or the data input terminal of the first controller and the data output terminal of the second controller are connected.

In order to achieve the above-mentioned object, in a test method of a printed circuit board related to the present invention, the board mounts:

a first semiconductor device including: a JTAG test unsupported external terminal for a high-speed interface; a JTAG test supported external terminal; a high-speed input/output circuit for inputting/outputting signals between the external terminal for a high-speed interface and an inner circuit; and a boundary scan flip-flop that is inserted between the inner circuit and the high-speed input/output circuit, the first semiconductor device in which a chain for boundary scan is prepared by a boundary scan flip-flop of the JTAG test supported external terminal and the inserted boundary scan flip-flop, and a second semiconductor device including: a JTAG test unsupported external terminal for a high-speed interface; a JTAG test supported external terminal; a high-speed input/output circuit for inputting/outputting signals between the external terminal for a high-speed interface and an inner circuit; and a boundary scan flip-flop that is inserted between the inner circuit and the high-speed input/output circuit, in which a chain for boundary scan is prepared by a boundary scan flip-flop of the JTAG test supported external terminal and the inserted boundary scan flip-flop. In a test method of a board on which the external terminal for a high-speed interface of the first semiconductor device and the external terminal for a high-speed interface of the second semiconductor device are connected by a signal transmission line, a JTAG test is conducted by assuming that an inner circuit of the first semiconductor device and an inner circuit of the second semiconductor circuit as a virtual JTAG test supported device, and by assuming that the high-speed input/output circuit and the external terminal for a high-speed interface of the first semiconductor device, the high-speed input/output circuit and the external terminal for a high-speed interface of the second semiconductor device and a part including the signal transmission line are assumed as a virtual JTAG test unsupported device.

In order to achieve the above-mentioned object, in a test method of a printed circuit board related to the present invention, the board mounts:

a first semiconductor device including: a JTAG test unsupported external terminal for a high-speed interface; a JTAG test supported external terminal; a high-speed input/output circuit for inputting/outputting signals between the external terminal for a high-speed interface and an inner circuit; a boundary scan flip-flop that is inserted between the inner circuit and the high-speed input/output circuit; and a selector, the first semiconductor device in which the selector can select whether a chain for boundary scan is prepared by both a boundary scan flip-flop of the JTAG test supported external terminal and the inserted boundary scan flip-flop or only by a boundary scan flip-flop of the JTAG test supported external terminal; and a second semiconductor device including: an external terminal for a high-speed interface that is connected with the external terminal for a high-speed interface of the first semiconductor device via a signal transmission line; a high-speed input/output circuit for inputting/outputting signals between the external terminal for a high-speed interface and an inner circuit; and a JTAG test supported external terminal. In this test method, a JTAG test can be conducted by selecting by the selector that a chain for boundary scan is prepared in the first semiconductor device using both a boundary scan flip-flop of the JTAG test supported external terminal and the inserted boundary scan flip-flop in the case where a boundary scan flip-flop is inserted between the inner circuit and the high-speed input/output device of the second semiconductor device or a JTAG test can be conducted by selecting by the selector that a chain for boundary scan is prepared in the first semiconductor device only using a boundary scan flip-flop of the JTAG test supported external terminal in the case where a boundary scan flip-flop is not inserted between the inner circuit and the high-speed input/output device of the second semiconductor device.

In order to achieve the above-mentioned object, in a test method of a printed circuit board related to the present invention, the board mounts:

a first semiconductor device including:
a first controller having: a JTAG test unsupported external terminal for a high-speed interface; a JTAG test supported external terminal; a high-speed input/output circuit for inputting/outputting signals between the external terminal for a high-speed interface and an inner circuit; a boundary scan flip-flop that is inserted between the inner circuit and the high-speed input/output circuit; a data input terminal used for a boundary scan flip-flop of the JTAG supported external terminal for externally inputting data; a data output terminal for outputting data to an external entity; a bypass register to short between the data input terminal and the data output terminal and a selection unit; and a second controller including: a data input terminal used for the inserted boundary scan flip flop and for externally inputting data; a data output terminal for outputting data to an external entity; a bypass register to short between the data input terminal and the data output terminal; and a selection unit, the first semiconductor in which the data output terminal of the first controller and the data input terminal of the second controller are connected or the data input terminal of the first controller and the data output terminal of the second controller are connected, the first and second controllers transmit data sequentially inputted from the respective data input terminals to a chain of the respective boundary scan flip-flops, receive data that circulates the chain once, at the same time write the input data in the respective bypass registers and output to the respective output terminals using the selection units one of the data that circulates once a chain of the boundary flip-flops and the data that are written in the bypass registers; and a second semiconductor device including, a JTAG unsupported external terminal for a high-speed interface connected with the JTAG unsupported external terminal for a high-speed interface of the first semiconductor device via a signal transmission line, a high-speed input/output circuit for inputting/outputting signals between the JTAG unsupported external terminal for a high-speed interface and an inner circuit and a JTAG supported external terminal. In the case where a boundary scan flip-flop is inserted between the inner circuit and the high-speed input/output circuit of the second semiconductor device, both the selection unit of the first controller and the selection unit of the second controller select data that circulates once a chain of the respective boundary flip-flops and output the data to the respective data output terminals. In the case where a boundary scan flip-flop is not inserted between the inner circuit and the high-speed input/output circuit of the second semiconductor device, the selection unit of the first controller selects data that circulates once a chain of the respective boundary flip-flops and outputs the selected data to the data output terminal while the selection unit of the second controller selects data written in the bypass register and outputs the selected data to the data output terminal, thereby conducting a JTAG test.

In order to achieve the above-mentioned object, in a data writing method of writing data in a storage circuit of a semiconductor device related to the present invention, the semiconductor device comprises:

a first controller having: a JTAG test unsupported external terminal for a high-speed interface; a JTAG test supported external terminal; a high-speed input/output circuit for inputting/outputting signals between the external terminal for a high-speed interface and an inner circuit; a boundary scan flip-flop that is inserted between the inner circuit and the high-speed input/output circuit; a data input terminal used for a boundary scan flip-flop of the JTAG supported external terminal and for externally inputting data; a data output terminal for outputting data to an external entity; a bypass register to short between the data input terminal and the data output terminal and a selection unit; and a second controller having: a data input terminal used for the inserted boundary scan flip flop and for externally inputting data; a data output terminal for outputting data to en external entity; a bypass register to short between the data input terminal and the data output terminal; and a selection unit. In this semiconductor device, the data output terminal of the first controller and the data input terminal of the second controller are connected or the data input terminal of the first controller and the data output terminal of the second controller are connected, the first and second controllers transmit data sequentially inputted from the respective data input terminals to a chain of the respective boundary scan flip-flops, receive data that circulates the chain once, at the same time write the input data in the respective bypass registers and output to the respective output terminals using the selection units one of the data that circulates once a chain of the respective boundary flip-flops and the data that are written in the respective bypass registers. In a method of writing data in the storage circuit of the semiconductor device having a storage circuit connected to the external terminal for a high-speed interface in the inner circuit, the selection unit of the first controller selects data written in the bypass register and outputs the selected data to the data output terminal while the selection unit of the second controller selects data that circulates once a chain of the boundary flip-flops and outputs the selected data to the data output terminal, thereby writing the data in the storage circuit using boundary scan flip-flops inserted among the second controller, the inner circuit and the high-speed input/output circuit.

BRIEF DESCRIPTION OF THE DRAWINGS

FIG. 1A shows a conventional example in which a high-speed signal terminal does not support a JTAG test;

FIG. 6 shows the second preferred embodiment;

FIG. 8 shows the fourth preferred embodiment and the configuration at the time of the JTAG test according to this embodiment;

DESCRIPTION OF THE PREFERRED EMBODIMENTS

One device is logically divided into two devices such as a JTAG test supported device and a JTAG test unsupported device, and a boundary scan FF is inserted between the two devices. Another device configured in the same way is prepared to be combined with the above-mentioned device and accordingly the JTAG unsupported parts of both devices are equivalently combined. This combined part is regarded as one JTAG TEST unsupported device and this device is sandwiched by the JTAG supported devices so that a JTAG test can be conducted.

As mentioned above, according to the present invention, a JTAG test of a printed circuit board including a semiconductor device that is provided with a JTAG test unsupported input/output terminal inside thereof can be conducted.

Figure 1B:
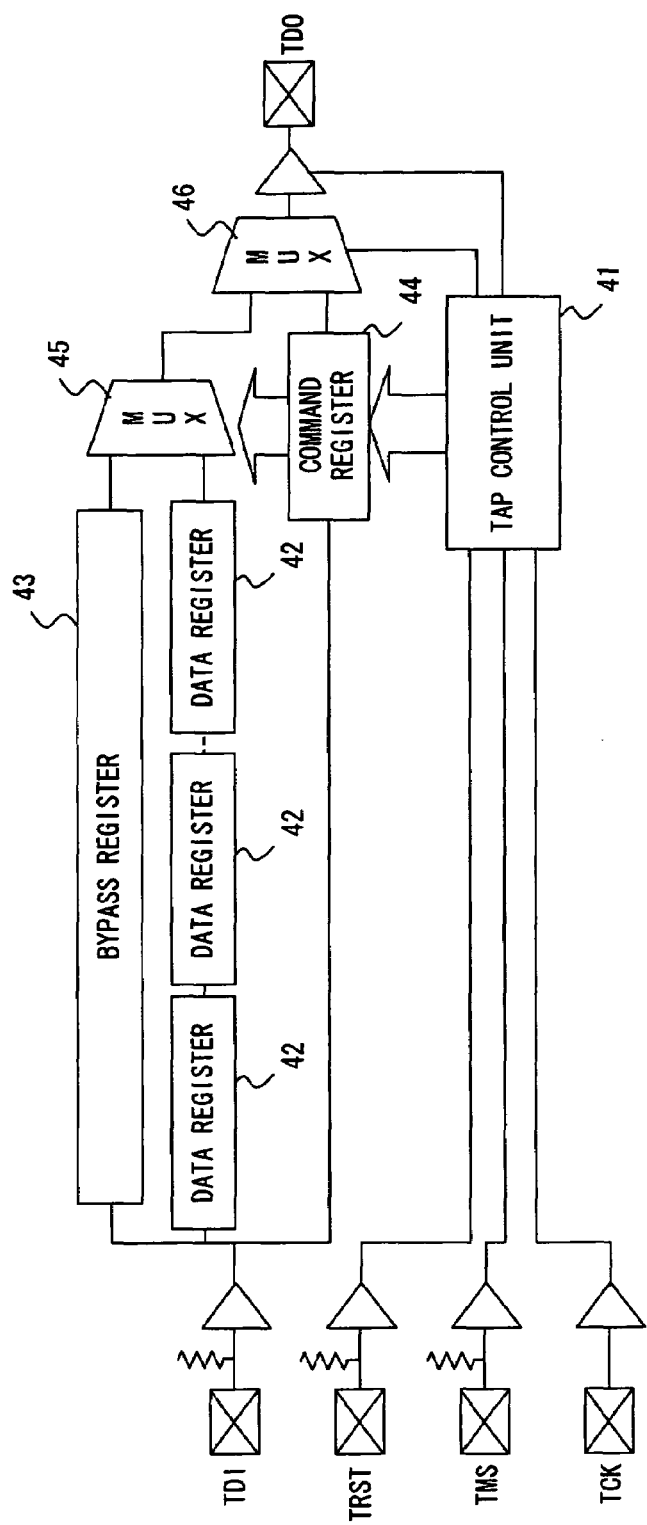
FIG. 1B shows a block diagram of a test access port (TAP)
Figure 2:
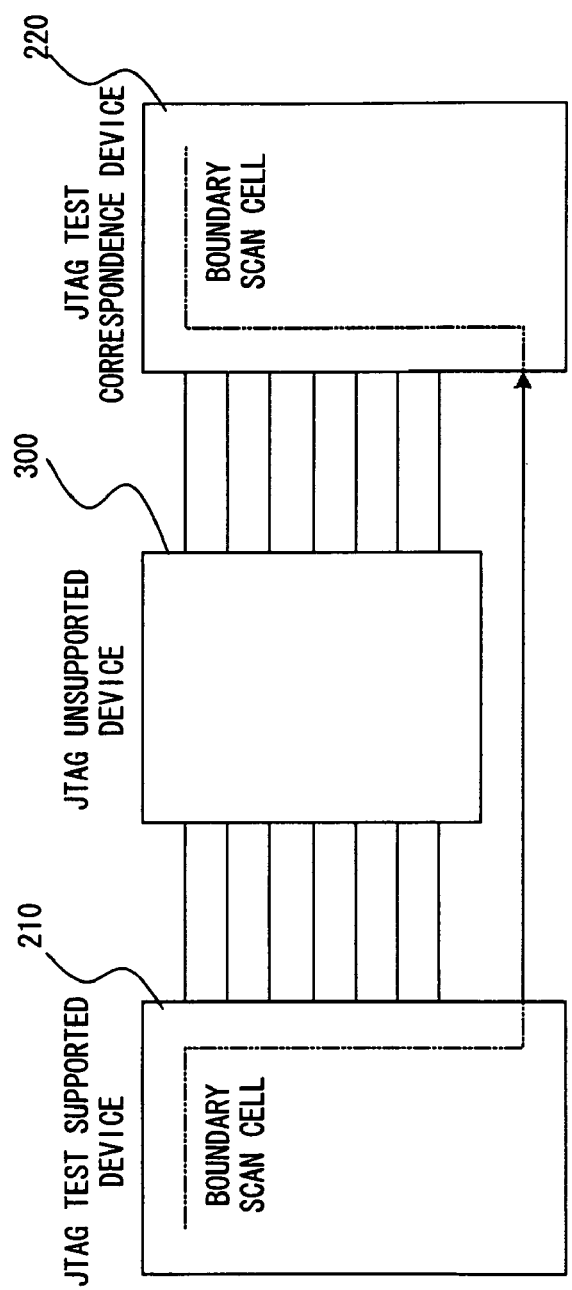
FIG. 2 shows a test method of a JTAG test unsupported device mounted on a printed circuit board.

The present invention expands an applicable scope of a JTAG test by adopting a configuration logically identical to that shown in FIG. 2 by setting a logical device boundary independently of a physical device boundary at one part thereof. In the present invention, the JTAG test unsupported part is an FF or a buffer for aligning timings of data and the logic can be easily specified. There is a case where a selector is inserted but the logic can be specified easily in the same way as in the above-mentioned case.

Figure 3:
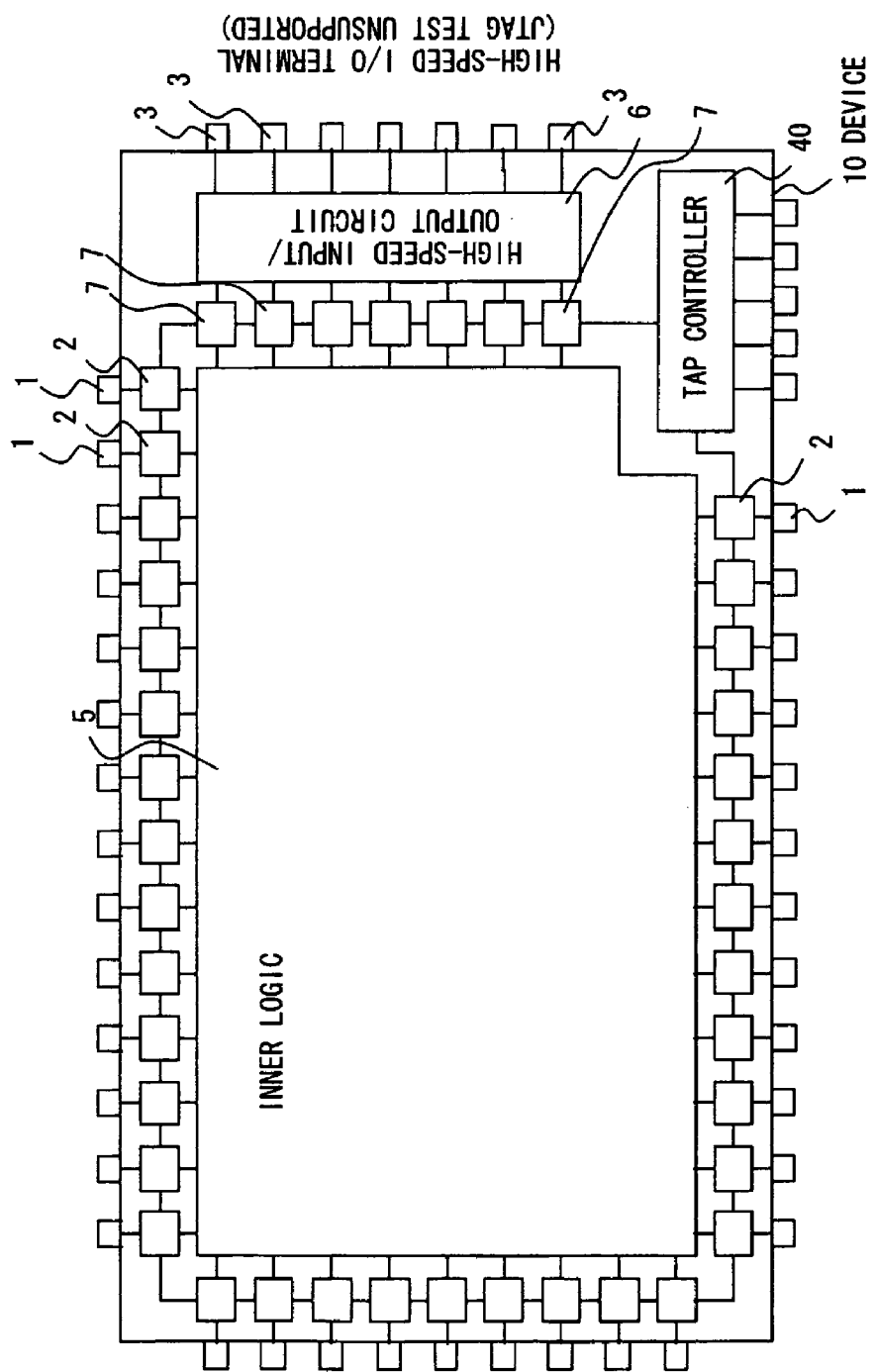
FIG. 3 shows the principle and the first preferred embodiment of the present invention.
Figure 4:
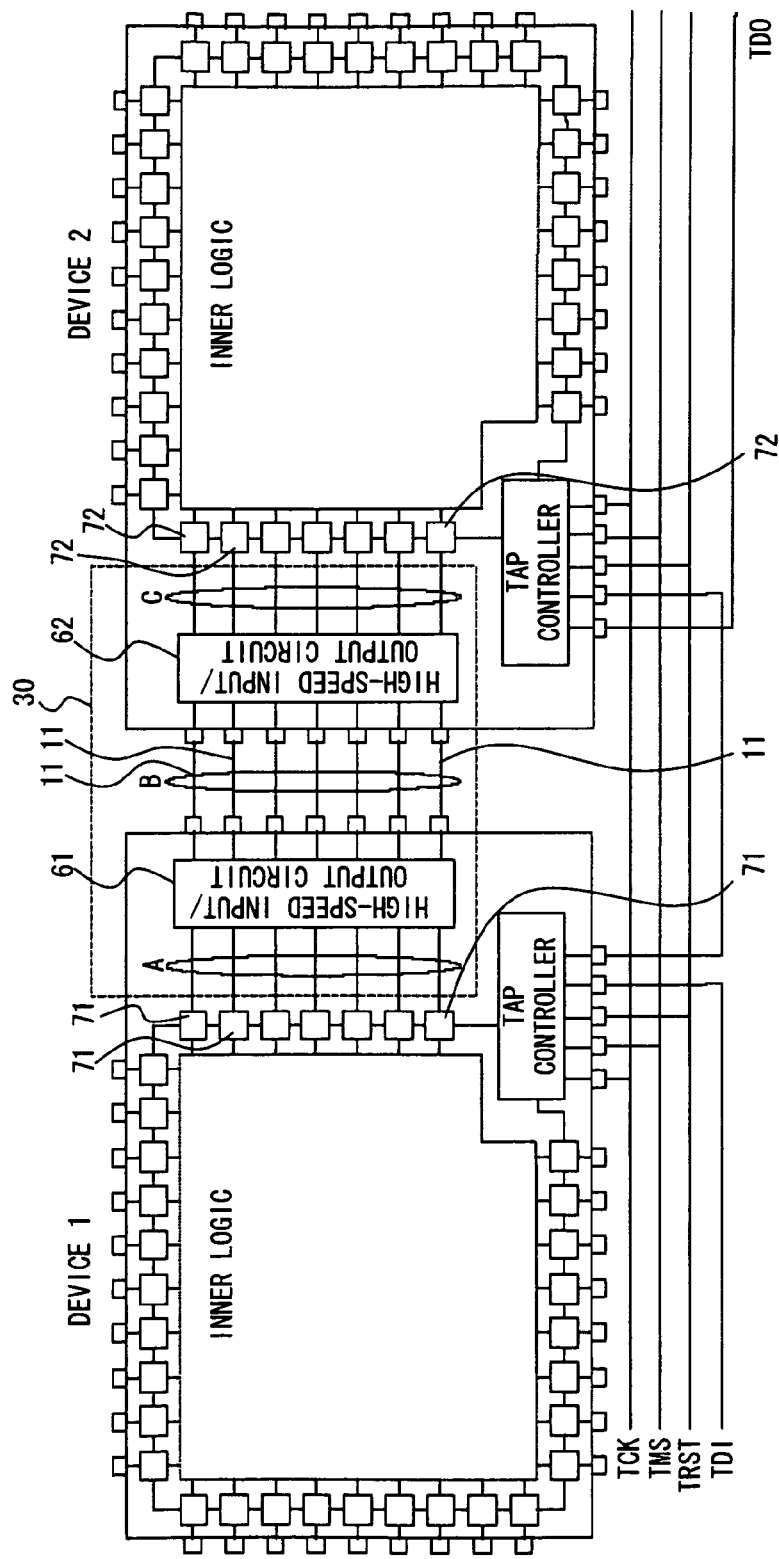
FIG. 4 shows the configuration at the time of a JTAG test of the first preferred embodiment.

FIG. 3 shows the principle of the present invention in a case where one device is targeted and also shows the first preferred embodiment. FIG. 4 shows a configuration in the case of testing a JTAG test unsupported part. In a device 10 as shown in FIG. 3, flip-flops 7 are inserted between an inner logic 5 and a high-speed input/output circuit 6 as shown in the drawing and these flip-flops become boundary scan FFs for the inner logic 5 by configuring a chain together with the boundary scan FFs 2.

In FIG. 4, a part surrounded by the dotted line indicates a virtual JTAG test unsupported device 30. As mentioned above, the logics of the input and the output can be easily specified in respect of this virtual device 30.

Figure 5:
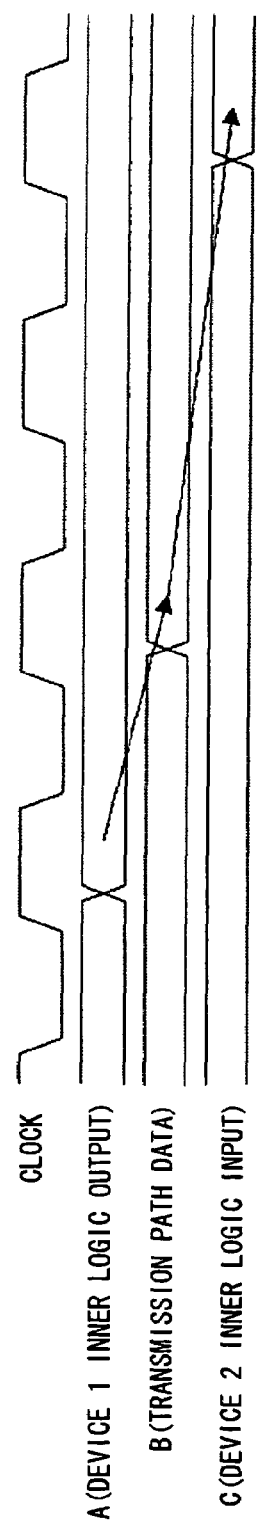
FIG. 5 shows an operation waveform at the time of a JTAG test of the first preferred embodiment.

The following is the explanation of operation examples of the present invention using the first preferred embodiment shown in FIGS. 4 and 5.

FIG. 5 shows an operation waveform in the case where a high-speed input/output circuit 61 of the device 1 and a high-speed input/output circuit 62 of the device 2 operate at the same clock as that of JTAG test and each of the delays is one clock, during a connection test between the devices shown in FIG. 4.

Since the data at a C point becomes DATA_C(n)=DATA_A(n−3), data arrives at a boundary scan FF 72 of the device 2 from a boundary scan FF 71 of the device 1 three clocks behind the clock of a JTAG test. Therefore, if the poor connection occurs on the device, this can be detected on a side of the device 2.

During a connection test between devices, the clocks of the high-speed input/output circuit 61 of the device 1 and the high-speed input/output circuit 62 of the device 2 are much faster than the clock of a JTAG test. That is, in the case where the clock is so fast that the data of A is transmitted to C from one leading edge of the JTAG test clock to the next leading edge, the delay caused by the high-speed input/output circuit can be ignored. In this case, data is transmitted between the device 1 and the device 2 independently of the JTAG test clock. However, data is transmitted within a predetermined time period and the same data is repeatedly transmitted until the data from a transmission side changes after data arrives so that no inconvenience occurs on the connection test between devices.

Furthermore, it becomes possible to carry out a JTAG test by regarding as one logical device the transmission path on a board including the high-speed input/output circuits 61 and 62 of the devices 1 and 2, respectively and the signal transmission line 11.

FIG. 6 shows the second preferred embodiment. The characteristic of the configuration of FIG. 6 is that a selector 8 is included in a boundary scan chain. This selector is used to select whether or not the configuration of the present invention is used. This selector causes the boundary scan FF 7 inserted between the high-speed input/output circuit 6 and another inner logic 5 not to be used in the case where the corresponding terminal of another device connected with the high-speed I/O terminal 3 of a device to which the present invention is applied, neither supports a JTAG test nor the configuration of the present invention is applied to the terminal. Whether or not the configuration of the present invention is used is controlled by a signal SEL that is externally given. If possible, a command may be added to a JTAG to be substituted for the signal SEL.

Figure 7:
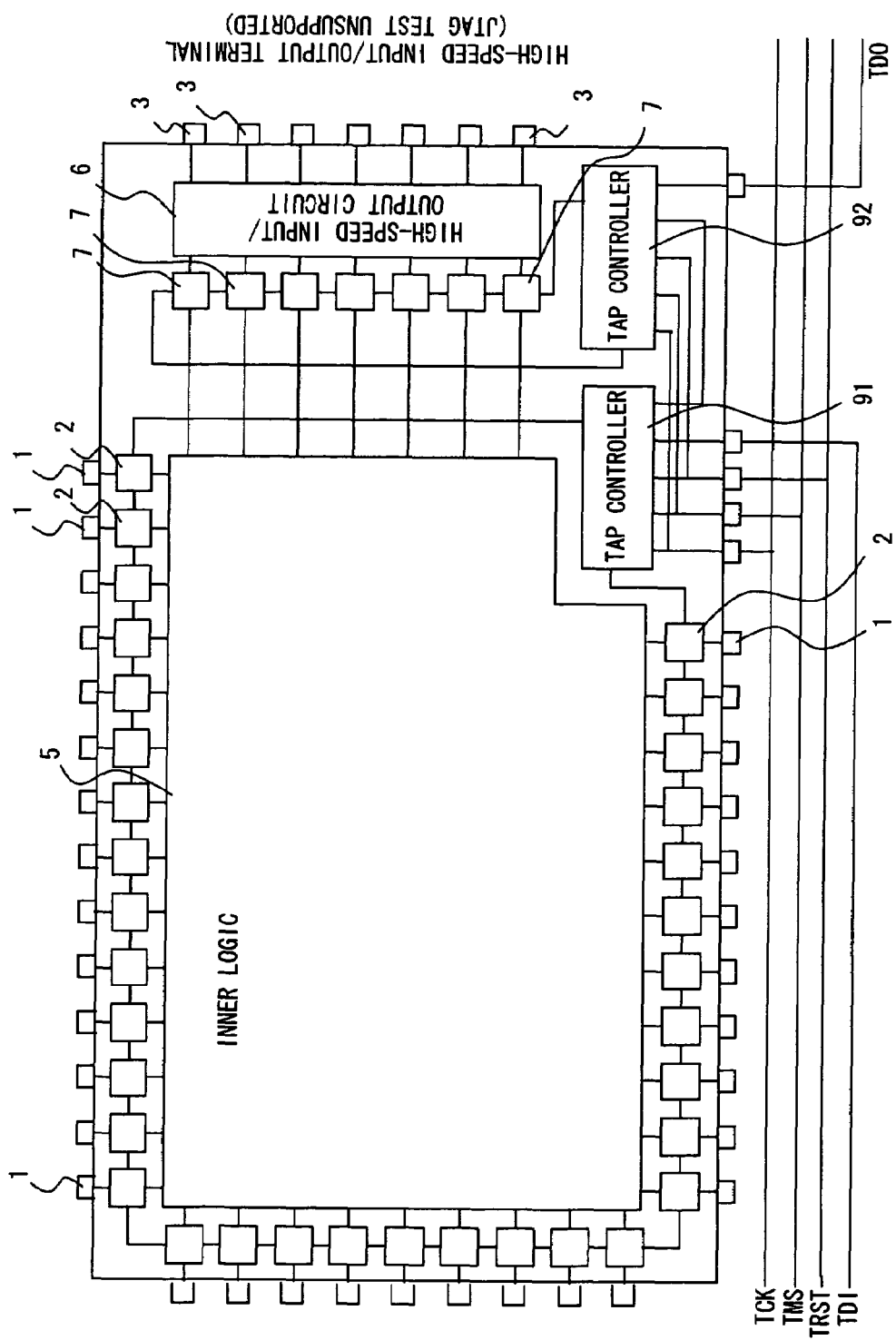
FIG. 7 shows the third preferred embodiment.

FIG. 7 shows the third preferred embodiment. FIG. 7 shows a case where two TAP controllers 91 and 92 are provided, and the boundary scan FFs 2 inserted between the inner logic 5 and an external terminal and the boundary scan FFs 7 inserted between the inner logic 5 and the high-speed input/output circuit 6 are prepared as respective chains. Since the test data output TDO of a TAP controller 91 and the test data input TDI of a TAP controller 92 are connected, it is possible to select whether or not the configuration of the present invention is used without using a selector nor an extra terminal as in the case shown in FIG. 6.

That is, the non-use of the configuration of the present invention can be selected by selecting the output of a bypass register of the TAP controller 92 based on a bypass command.

Furthermore, when a bypass register of the TAP controller 91 is used, the boundary scan FFs 2 included between the inner logic 5 and the external terminals 1 can be bypassed. Therefore, in the case where a programmable ROM, etc. of the inner logic 5 are connected with the high-speed I/O terminal 3, the program of a ROM, etc. that use JTAG tests can be executed in a short time.

Figure 9:
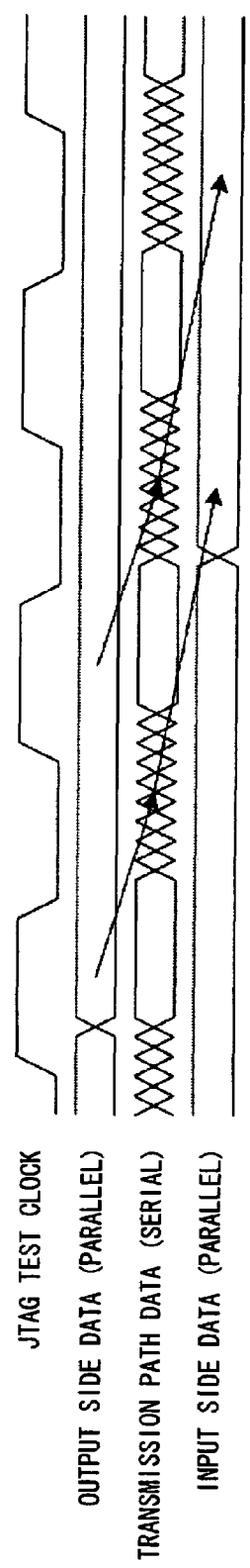
FIG. 9 shows an operation waveform at the time of the JTAG test according to the fourth preferred embodiment.

FIG. 8 shows the fourth preferred embodiment while FIG. 9 shows the operation waveforms. FIG. 8 shows a preferred embodiment in the case where data is serially transmitted between devices. In this case, a high-speed input/output circuit becomes serial input/output circuits 63 and 64, and the number of signal lines between the devices is less than that of connection signal lines connected with the inner circuit. The serial input/output circuits 63 and 64 carry out parallel/serial conversion, code conversion and serial/parallel conversion. In the case where the circuits have error correction functions, when a poor connection occurs, the connection is detected as an error that cannot be repaired. There is a case where data transmission between devices has a latency longer than a JTAG test clock by one, however it is possible to prepare a test program in consideration of the delay of the maximum number of clocks. In this case, it is preferable to figure out the longer delay rather than the real delay. As in the first preferred embodiment, the same data is transmitted after the data is properly transmitted so that a connection test can be conducted. In this case, a serial input/output circuit and a clock generation circuit for serial input/output are required to operate in the same way as in a general operation even during a JTAG test.

Figure 10:
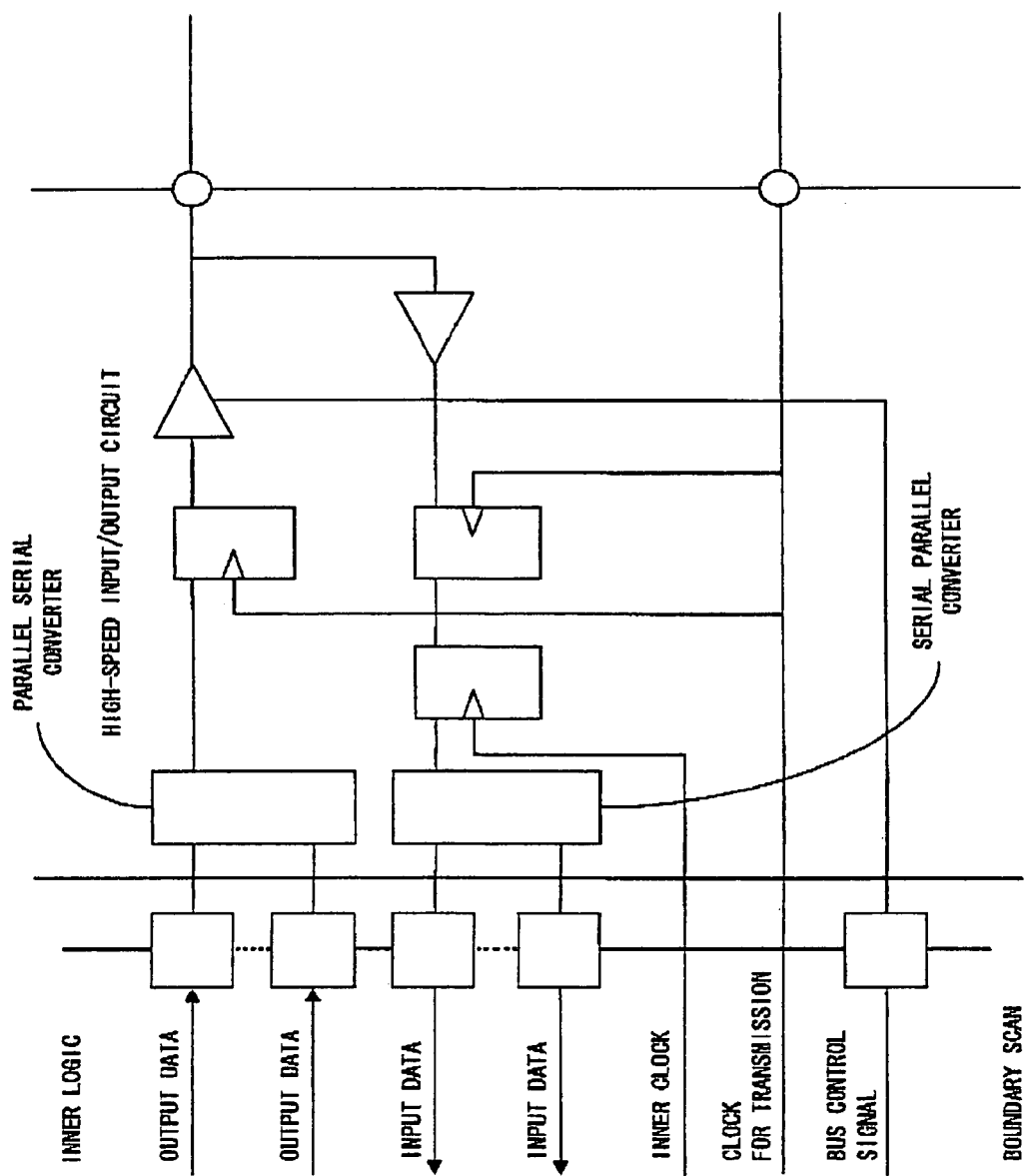
FIG. 10 shows an example in which devices are connected via a bus.

FIG. 10 shows an example in which devices are connected via a bus. In FIG. 10, a signal to be transmitted includes only a data signal of one bit and a clock, but the number of items included in a transmitted signal can be increased if necessary. In the case of a bus terminal supporting a JTAG test, two boundary scan FFs are inserted into one terminal. In the configuration of the present invention, a space between the inner logic and the high-speed input/output circuit is divided into a line for input and a line for output so that the number of boundary scan FFs in respect of data stays unchanged. FIG. 10 shows an example in which a boundary scan FF is not inserted into a clock, but the FF may be inserted. The clock for transmission shows an example in which a device outputs the clock differently from a JTAG test clock even during a JTAG test, but the clock may be the same as the JTAG clock or may be externally inputted.

Figure 11:
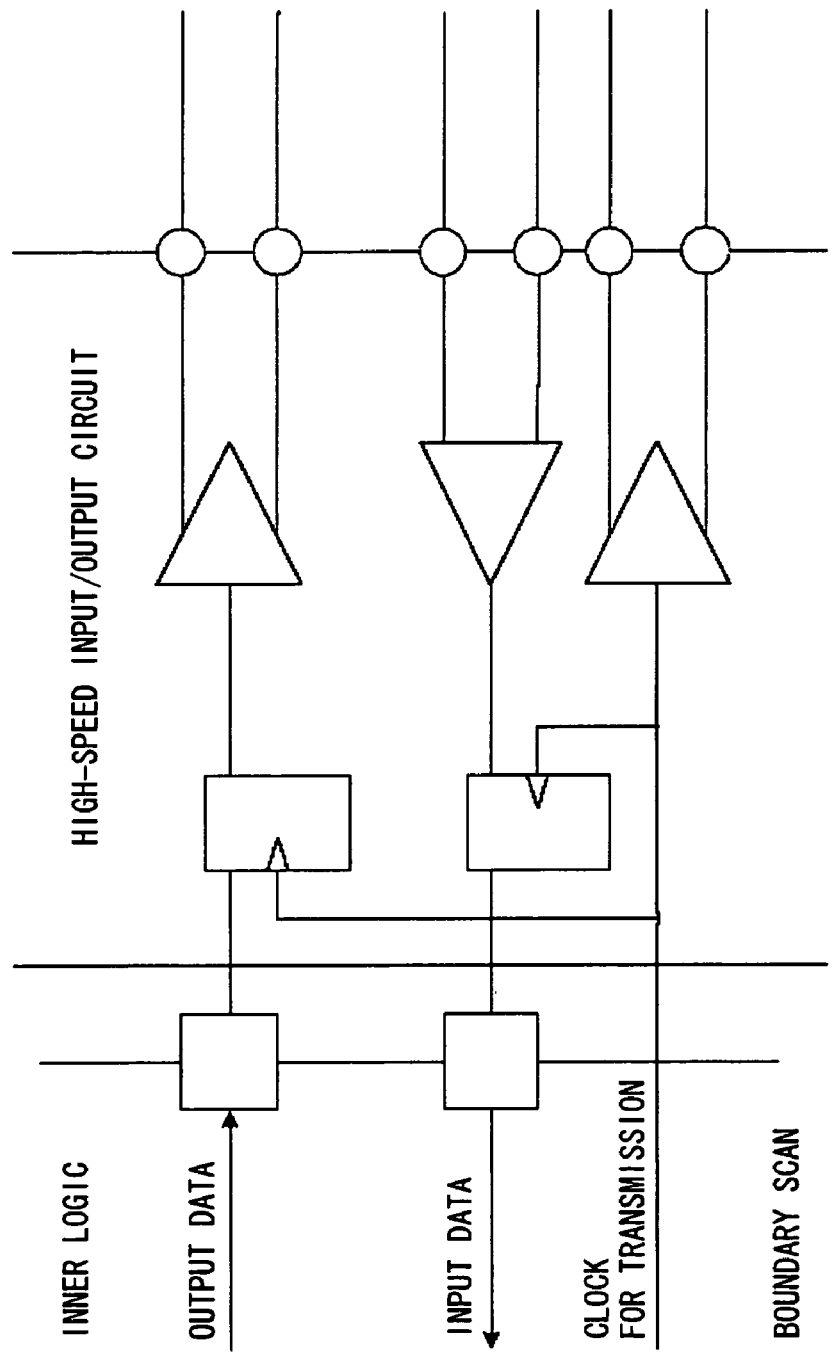
FIG. 11 shows an example in which devices are connected via a differential signal.

FIG. 11 shows an example in which data is transmitted using a differential signal. In FIG. 11, the data of each of input and output is set to one bit but the number of bits can be increased if necessary. The number of inserted boundary scan FFs is less than the number of connection signal lines between devices but a connection test between devices can be conducted. Since a differential signal amplitude is generally small, there are some cases where changes such that a transmission clock is made delayed, the output amplitude is made large, etc. are required at the time of a connection test between devices in the case where an I/O buffer with a function of fixing one level of a differential signal is used. This is because when one level of a differential signal is fixed, the signal amplitude becomes small if the signal is regarded as a differential signal.

As explained above, one device is logically divided into two devices such as a JTAG test supported device and a JTAG test unsupported device, a boundary scan FF is inserted between the two devices to be combined with another device configured in the same way and the JTAG unsupported parts of both devices are equivalently combined to be regarded as one JTAG test unsupported device. Then, this device is sandwiched by the JTAG supported devices so that a JTAG test can be conducted even for a terminal for inputting/outputting a signal the speed of which is too high to satisfy the AC standard of a terminal. Especially, a JTAG test can be also conducted for a terminal for serial data transmission between devices.

What is claimed is:

1. A semiconductor device comprising:
    an inner circuit;
    first boundary scan flip-flops, coupled to the inner circuit, for a JTAG test;
    first external terminals coupled to the first boundary scan flip-flops for the JTAG test;
    second external terminals for a high-speed interface not coupled to the first boundary scan flip-flops for the JTAG test;
    a high-speed input and output circuit for inputting and outputting signals between at least one of the second external terminals for the high-speed interface and the inner circuit in response to a clock which has a higher frequency than a frequency of a clock for the JTAG test, and
    second boundary scan flip-flops provided between the inner circuit and the high-speed input and output circuit; wherein a chain used for boundary scan is prepared by the first boundary scan flip-flops and the second boundary scan flip-flops; and wherein the first and second boundary scan flip-flops are scanned with test data for a test of the semiconductor device in the JTAG test.

2. The semiconductor device according to claim 1, further comprising:

a selector providing for selecting whether the chain for boundary scan is prepared only by the first boundary scan flip-flops of the first external terminals or by the first boundary scan flip-flops of the first external terminals and the second boundary scan flip-flops.

3. The semiconductor device of claim 1, further comprising:

a first controller including: a data input terminal used for the first boundary scan flip-flops of the first external terminal and for externally inputting data; and a data output terminal for outputting data to an external entity data; and a second controller including: a data input terminal used for the second boundary scan flip-flops and for externally inputting data; and a data output terminal for outputting data to an external entity, wherein the data output terminal of the first controller and the data input terminal of the second controller are coupled or the data input terminal of the first controller and the data output terminal of the second controller are coupled.

4. The semiconductor device according to claim 3, wherein the first and second controllers transmit data that are sequentially inputted from the respective data input terminals to the chain of the respective boundary scan flip-flops, receive data that circulates the chain once and output the received data from the respective data output terminals.

5. The semiconductor device according to claim 4, wherein the first and second controllers are provided with a bypass register to short between the respective data input terminals and the data output terminals and a selection unit to output one of data that circulates the chain of the respective boundary scan flip-flops once and data of the bypass register to the respective output terminals.

6. The semiconductor device according to claim 1, wherein:

at least one of the second external terminal for a high-speed interface is provided with a terminal for serial data transmission; and the high-speed input and output circuit is provided with a parallel/serial converter and a serial/parallel converter.

7. The semiconductor device according to claim 6, wherein:

serial data transmission between semiconductor devices is executed at a clock different from a clock of the JTAG test during a connection test between semiconductor devices according to the JTAG test; and data of the second boundary scan flip flop is always transmitted to a semiconductor device on a receipt side.

8. A method for testing a printed circuit board mounting:

a first semiconductor device comprising: first external terminals coupled to first boundary scan flip-flops for a JTAG test; second external terminals for a high-speed interface not coupled to the first boundary scan flip-flops for the JTAG test; a high-speed input and output circuit for inputting and outputting signals between the second external terminals for the high-speed interface and an inner circuit, wherein the high-speed input and output circuit inputs and outputs the signals in response to a clock which has a higher frequency than a frequency of a clock for the JTAG test; second boundary scan flip-flops that are inserted between the inner circuit and the high-speed input and output circuit; and a selector, the selector being able to select whether a chain for boundary scan is prepared by the first boundary scan flip-flops of the first external terminals and the second boundary scan flip-flops or only by the first boundary scan flip-flops of the first external terminals; and a second semiconductor device comprising; external terminals for a high-speed interference coupled with the second external terminals for the high-speed interference of the first semiconductor device via a signal transmission line; a high-speed input and output circuit for inputting and outputting signals between the external terminals for the high-speed interface and an inner circuit; and external terminals coupled to first boundary scan flip-flops for a JTAG test, wherein:

a JTAG test is conducted by selecting and preparing a chain for boundary scan by the selector in the first semiconductor device by the first boundary scan flip-flops of the first external terminals and the inserted boundary scan flip-flops in a case where boundary scan flip-flops are inserted between the inner circuit and the high-speed input and output device of the second semiconductor device; and a JTAG test is conducted by selecting and preparing a chain for boundary scan by the selector in the first semiconductor device only by the first boundary scan flip-flops of the first external terminal in a case where boundary scan flip-flops are not inserted between the inner circuit and the high-speed input and output device of the second semiconductor device;

wherein the first and second boundary scan flip-flops are scanned with test data for a test of the semiconductor device in the JTAG test.

9. The method of claim 8, wherein:

the first semiconductor device further comprises a first controller used for the first boundary scan flip-flops of the first external terminals, having a data input terminal for externally inputting data, a data output terminal for outputting data to an external entity, a bypass register to short between the data input terminal and the data output terminal, and a selection unit; and a second controller used for the second boundary scan flip-flops, having a data input terminal for externally inputting data, a data output terminal for outputting data to an external entity, a bypass register to short between the data input terminal and the data output terminal and a selection unit, the data output terminal of the first controller and the data input terminal of the second controller being coupled with each other or the data input terminal of the first controller and the data output terminal of the second controller being coupled with each other, the first and second controllers transmitting data that are sequentially inputted from the respective data input terminals to a chain of the respective boundary scan flip-flops, receiving data that circulates the chain once, writing the input data in the respective bypass registers and outputting to the respective data output terminals using the selection unit, either one of data that circulates the chain of the respective boundary flip-flops once or data written in the bypass register; and wherein:

both the selection unit of the first controller and the selection unit of the second controller select data that circulates the chain of the respective boundary flip-flops once and output the data to the respective data output terminals in a case where boundary scan flip-flops are inserted between the inner circuit and the high-speed input and output device of the second semiconductor device; and the selection unit of the first controller selects data that circulates the chain of the respective boundary flip-flops once and outputs the selected data to the data output terminal and the selection unit of the second controller selects data written in the bypass register and outputs the selected data to the data output terminal in a case where boundary scan flip-flops are not inserted between the inner circuit and the high-speed input and output device of the second semiconductor device, thereby conducting the JTAG test.

10. A method for writing data in a storage circuit of a semiconductor device, the semiconductor device comprising:

first external terminals coupled to first boundary scan flip-flops for a JTAG test;

second external terminals for a high-speed interface not coupled to the first boundary scan flip-flops for the JTAG test; and a high-speed input and output circuit for inputting and outputting signals between the second external terminals for the high-speed interface and the inner circuit, wherein the high-speed input and output circuit inputs and outputs the signals in response to a clock which has a higher frequency than a frequency of a clock for the JTAG test;

second boundary scan flip-flops inserted between the inner circuit and the high-speed input and output circuit, wherein the first and second boundary scan flip-flops are scanned with test data for a test of the semiconductor device in the JTAG test;

a first controller used for the first boundary scan flip-flops of the first external terminals, having a data input terminal for externally inputting data, a data output terminal for outputting data to an external entity, a bypass register to short between the data input terminal and the data output terminal, and a selection unit; and a second controller used for the second boundary scan flip-flops, having a data inputting terminal for externally inputting data, a data output terminal for outputting data to an external entity, a bypass register to short between the data input terminal and the data output terminal, and a selection unit, the data output terminal of the first controller and the data input terminal of the second controller being coupled with each other or the data input terminal of the first controller and the data output terminal of the second controller being coupled with each other, the first and second controllers transmitting data that are sequentially inputted from the respective data input terminals to a chain of the respective boundary scan flip-flops, receiving data that circulates the chain once, writing the input data in the respective bypass registers and outputting to the respective data output terminals using the selection unit, either one of data that circulates the chain of the respective boundary flip-flops once or data written in the bypass register, the inner circuit including the storage circuit which is coupled with the second external terminals for the high-speed interface, wherein:

the selection unit of the first controller selects data written in the bypass register and outputs the selected data to the data output terminal; and the selection unit of the second controller selects data that circulates the chain of the boundary flip-flops once and outputs the selected data to the data output terminal, thereby writing the data in the storage circuit using the boundary scan flip-flops inserted among the second controller, the inner circuit and the high-speed input and output circuit.

11. A method for testing a printed circuit board mounting:

a first semiconductor device comprising:

first external terminals coupled to first boundary scan flip-flops for a JTAG test;

second external terminals for a high-speed interface not coupled to the first boundary scan flip-flops for the JTAG test; and a high-speed input and output circuit for inputting and outputting signals between the second external terminals for the high-speed interface and the inner circuit, wherein the high-speed input and output circuit inputs and outputs the signals in response to a clock which has a higher frequency than a frequency of a clock for the JTAG test;

second boundary scan flip-flops inserted between the inner circuit and the high-speed input and output circuit, wherein the first and second boundary scan flip-flops are scanned with test data for a test of the semiconductor device in the JTAG test;

a first controller used for the first boundary scan flip-flops of the first external terminal, having a data input terminal for externally inputting data, a data output terminal for outputting data to an external entity, a bypass register to short between the data input terminal and the data output terminal, and a selection unit; and a second controller used for the second boundary scan flip-flops, having a data input terminal for externally inputting data, a data output terminal for outputting data to an external entity, a bypass register to short between the data input terminal and the data output terminal, and a selection unit, the data output terminal of the first controller and the data input terminal of the second controller being coupled with each other or the data input terminal of the first controller and the data output terminal of the second controller being coupled with each other, the first and second controllers transmitting data that are sequentially inputted from the respective data input terminals to a chain of the respective boundary scan flip-flops, receiving data that circulates the chain once, writing the input data in the respective bypass registers and outputting to the respective data output terminals using the selection units, either one of data that circulates the chain of the respective boundary flip-flops once or data written in the bypass registers; and second semiconductor device comprising: external terminals for a high-speed interface coupled with the second external terminals for the high-speed interface of the first semiconductor device via a signal transmission line; a high-speed input and output circuit for inputting and outputting signals between the external terminals for the high-speed interface and an inner circuit; and external terminals coupled to boundary scan flip-flops for a JTAG test, wherein:

both the selection unit of the first controller and the selection unit of the second controller select data that circulates the chain of the respective boundary flip-flops once and output the data to the respective data output terminal in a case where boundary scan flip-flops are inserted between the inner circuit and the high-speed input and output circuit of the second semiconductor device; and the selection unit of the first controller selects data that circulates the chain of the respective boundary flip-flops once and outputs the selected data to the data output terminal and the selection unit of the second controller selects data written in the bypass register and outputs the selected data to the data output terminal in a case where boundary scan flip-flops are not inserted between the inner circuit and the high-speed input and output circuit of the second semiconductor device, thereby conducting a JTAG test.

12. A method for writing data in a storage circuit of a semiconductor device, the semiconductor device comprising:

first external terminals coupled to first boundary scan flip-flops for a JTAG test;

second external terminals for a high-speed interface not coupled to the first boundary scan flip-flops for the JTAG test; and a high-speed input and output circuit for inputting and outputting signals between the second external terminals for the high-speed interface and the inner circuit, wherein the high-speed input and output circuit inputs and outputs the signals in response to a clock which has a higher frequency than a frequency of a clock for the JTAG test;

second boundary scan flip-flops inserted between the inner circuit and the high-speed input and output circuit, wherein the first and second boundary scan flip-flops are scanned with test data for a test of the semiconductor device in the JTAG test;

a first controller used for the first boundary scan flip-flops of the first external terminals, including a data input terminal for externally inputting data, a data output terminal for outputting data to an external entity, a bypass register to short between the data input terminal and the data output terminal, and a selection device; and a second controller used for the second boundary scan flip-flops, including a data input terminal for externally inputting data, a data output terminal for outputting data to an external entity, a bypass register to short between the data input terminal and the data output terminal and a selection device, the data output terminal of the first controller and the data input terminal of the second controller being coupled with each other or the data input terminal of the first controller and the data output terminal of the second controller being coupled with each other, the first and second controllers transmitting data that are sequentially inputted from the respective data input terminals to a chain of the respective boundary scan flip-flops, receiving data that circulates the chain once, writing the input data in the respective bypass registers and outputting to the respective data output terminals using the selection units, either one of data that circulates the chain of the respective boundary flip-flops once or data written in the bypass register, the inner circuit including the storage circuit which is coupled with the second external terminals for the high-speed interface, wherein:

the selection unit of the first controller selects data written in the bypass register and outputs the selected data to the data output terminal; and the selection unit of the second controller selects data that circulates the chain of the boundary flip flops once and outputs the selected data to the data output terminal, thereby writing the data in the storage circuit using the boundary scan flip-flops inserted among the second controller, the inner circuit and the high-speed input and output circuit.

* * * * *